United States Patent
Klaassen et al.

(10) Patent No.: US 8,958,053 B2
(45) Date of Patent: Feb. 17, 2015

(54) LITHOGRAPHIC APPARATUS AND ALIGNMENT METHOD

(75) Inventors: Michel François Hubert Klaassen, Eindhoven (NL); Hermanus Johannes Maria Kreuwel, Schijndel (NL)

(73) Assignee: ASML Netherlands B.V., Veldhoven (NL)

( * ) Notice: Subject to any disclaimer, the term of this patent is extended or adjusted under 35 U.S.C. 154(b) by 808 days.

(21) Appl. No.: 13/186,028

(22) Filed: Jul. 19, 2011

(65) Prior Publication Data
US 2012/0038898 A1  Feb. 16, 2012

Related U.S. Application Data

(60) Provisional application No. 61/372,703, filed on Aug. 11, 2010.

(51) Int. Cl.
*G03F 7/20* (2006.01)

(52) U.S. Cl.
CPC ........ *G03F 7/70133* (2013.01); *G03F 7/70141* (2013.01); *G03F 7/702* (2013.01)
USPC ............................ 355/67; 250/504 R; 355/77

(58) Field of Classification Search
CPC . G03F 7/70133; G03F 7/70141; G03F 7/702; G03F 7/70033; G03F 7/7085; G03F 7/70175; G03F 7/70233; H05G 2/003; G21K 2201/067; G02B 5/0891; G02B 19/0047; G01J 1/429
USPC ................. 355/30, 53, 67, 71, 77; 250/504 R
See application file for complete search history.

(56) References Cited

U.S. PATENT DOCUMENTS

| | | | |
|---|---|---|---|
| 6,239,878 B1 * | 5/2001 | Goldberg | 356/520 |
| 7,113,261 B2 * | 9/2006 | Dierichs et al. | 355/68 |
| 8,704,199 B2 * | 4/2014 | Klaassen et al. | 250/504 R |
| 2005/0270511 A1 * | 12/2005 | Dierichs et al. | 355/67 |
| 2005/0274897 A1 * | 12/2005 | Singer et al. | 250/372 |
| 2008/0049206 A1 * | 2/2008 | Ossmann | 355/68 |
| 2010/0140512 A1 * | 6/2010 | Suganuma et al. | 250/504 R |
| 2010/0258750 A1 * | 10/2010 | Partlo et al. | 250/504 R |

* cited by examiner

*Primary Examiner* — Steven H Whitesell Gordon
(74) *Attorney, Agent, or Firm* — Sterne, Kessler, Goldstein & Fox P.L.L.C

(57) ABSTRACT

A lithographic apparatus comprising a source collector module including a collector, configured to collect radiation from a radiation source; an illuminator configured to condition the radiation collected by the collector and to provide a radiation beam; and a detector arrangement comprising a reflector arrangement disposed in a fixed positional relationship with respect to the illuminator, the reflector arrangement being arranged to reflect radiation from the source collector module; and a sensor arrangement disposed in a fixed positional relationship with respect to the reflector arrangement, the sensor arrangement being configured to measure at least one property of radiation reflected by the reflector, the detector arrangement being configured to determine the location of a far field position of the radiation as a function of at least one property of the radiation reflected by the reflector and measured by the sensor arrangement.

15 Claims, 7 Drawing Sheets

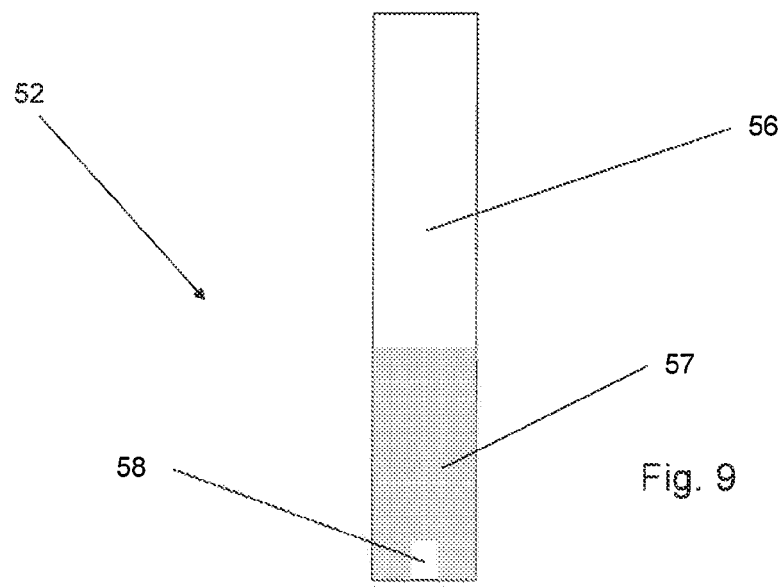
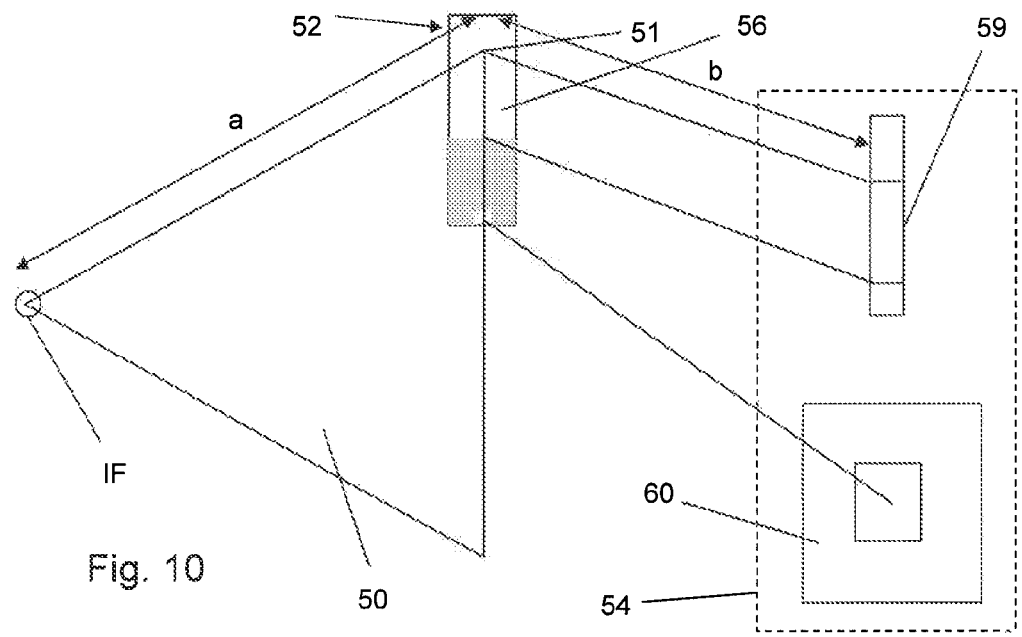

LITHOGRAPHIC APPARATUS AND ALIGNMENT METHOD

CROSS REFERENCE TO RELATED APPLICATIONS

This application claims benefit under 35 U.S.C. 119(e) to U.S. Provisional Application No. 61/372,703, filed Aug. 11, 2010, which is incorporated by reference herein in its entirety.

BACKGROUND OF THE INVENTION

1. Field of the Invention

The present invention relates to a lithographic apparatus and a method for aligning portions of a lithographic apparatus.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system configured to produce EUV radiation may include a laser configured to excite a fuel to provide the plasma, and a source collector module configured to contain the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

The orientation and/or position of the collector will determine the direction in which radiation is directed from the collector (e.g., reflected from the collector). It is desirable that radiation collected by the collector is accurately directed to parts of the lithographic apparatus, and it is therefore desirable for the collector to direct radiation in a specific direction. The radiation directed in a specific direction may be referred to as a radiation beam. An illuminator (sometimes referred to as an "illumination system" or "illumination arrangement") is a part of the lithographic apparatus that receives a radiation beam from the collector. The illuminator may condition the radiation beam and direct it to a patterning device.

The projection of the radiation beam onto a particular plane may be referred to as the far field. Far field referred herein may thus be understood as the projection of the radiation beam that enters the illumination system onto a particular plane situated in the path of the radiation beam. Hence the far field is an image (onto the particular plane) of the radiation beam directed at the particular plane by the collector. The projection of the radiation beam on to any appropriate plane may be referred to as the far field. An example of a plane on to which the radiation beam may be projected (and thus form the far field) is the first optical surface of the illuminator. The first optical surface of the illuminator may be a surface of a reflector. The reflector may be the first reflector the radiation beam is incident upon as it traverses the illuminator. The far field position is a reference position which may be used to describe the location of the far field. The far field position may be any appropriate position which describes the location of the far field. For example, the far field position may be the centre center of the image formed on the plane of the far field (i.e., the center of the projection). The center of the image may be the geometric center of the image, or in some cases the center of the image may be the position of the average center of the power distribution of the image.

The far field (and hence the far field position) are preferably located within certain boundaries in order to improve the operating performance of the illuminator (and hence the imaging performance and/or throughput of the lithographic apparatus). For example, if the far field is the projection of the radiation beam on to the surface of the first reflector the radiation beam is incident upon as it traverses the illuminator, it may be desirable for the far field to be such that it substantially does not extend beyond the extent of the surface of the first reflector. Alternatively or in addition, it may be desirable for the far field position (which in this case is defined by the geometric center of the projection) to be located substantially at the geometric center of the surface of the first reflector. For example, if the surface of the reflector is substantially circular and the far field projected on to the surface of the reflector is also substantially circular, then the radius of the far field may be substantially equal to the radius of the surface of the reflector and the far field position may be located substantially at the geometric center of the reflector.

The location of the far field (and hence the far field position) depends on the collector orientation and position. When a lithographic apparatus is constructed and used for the first time, it may be possible to ensure that the collector directs radiation in such a specific direction. However, over time it can be difficult to ensure that the radiation beam is directed in this specific direction. For instance, movement of parts of the lithographic apparatus (e.g., parts of the radiation source) can shift the direction of radiation. Additionally or alternatively, when parts of the lithographic apparatus are replaced (e.g., for maintenance purposes) a misalignment of replacement parts can shift the direction of radiation.

It is therefore desirable to align or re-align a collector of a radiation source and parts of the lithographic apparatus located further along the path of the radiation beam. Because the illuminator is a part of the lithographic apparatus that receives radiation directed by the collector it may be desirable to align or re-align the collector and the illuminator so that the far field (and hence far field position) is located within certain boundaries.

According to a first aspect of the invention there is provided a lithographic apparatus comprising a source collector module including a collector, configured to collect radiation from a radiation source; an illuminator configured to condition the radiation collected by the collector and to provide a radiation beam; and a detector arrangement comprising a reflector arrangement disposed in a fixed positional relationship with respect to the illuminator, the reflector arrangement being arranged to reflect radiation from the source collector module; and a sensor arrangement disposed in a fixed positional relationship with respect to the reflector arrangement, the sensor arrangement being configured to measure at least one property of radiation reflected by the reflector, the detector arrangement being configured to determine the location of a far field position of the radiation as a function of at least one property of the radiation reflected by the reflector and measured by the sensor arrangement.

The far field position may be the geometric center of the far field or the average center of the power distribution of the far field.

The sensor arrangement may comprise a one-dimensional sensor.

The reflector arrangement may comprise a generally planar reflector.

The reflector arrangement may further comprise an isolated reflector region.

The reflector arrangement may further comprise a substantially unreflective region and a reflective region, the substantially unreflective region being between the reflective region and the isolated reflector region.

The substantially unreflective region, reflective region and isolated reflector region may be formed as a one-piece component or as integral components.

The reflector arrangement may comprise a curved reflector.

The radius of curvature (R) of the reflector may be given by $$R = \frac{4ab}{(b+2a)}$$

where a is the distance between an intermediate focus of the radiation collected by the collector and a center of the curved reflector and b is the distance between the center of the curved reflector and the sensor arrangement.

The curvature of the reflector may be configured such that a change in far field position measured by the detector arrangement due to a relative translation between the source collector module and illuminator by a distance of 1 mm is the same as a change in far field position measured by the detector arrangement due to a relative tilt between the source collector module and illuminator about an intermediate focus of 1/a mrad, where a is the distance between an intermediate focus of the radiation collected by the collector and a center the curved reflector.

The curvature of the reflector may be configured such that a change in far field position measured by the detector arrangement due to a relative translation between the source collector module and illuminator by a distance of 1 mm is the same as a change in far field position measured by the detector arrangement due to a relative tilt between the source collector module and illuminator about an intermediate focus of 1/a mrad, where a is the distance between an intermediate focus of the radiation collected by the collector and a center of the curved reflector. The lithographic apparatus may additionally comprise an isolated reflective feature, at least part of which is mounted to or forms part of the collector, wherein the isolated reflective feature comprises a reflector portion located in a fixed positional relationship with the collector at a radial distance which is less than the radius of the collector, the reflector portion being surrounded by a relatively unreflective portion.

The sensor arrangement may comprise a two-dimensional sensor.

The two-dimensional sensor may be a position sensitive device (PSD) or a charge coupled device (CCD).

The one-dimensional sensor may be an edge detection sensor.

The detector arrangement may comprise a plurality of similar reflector arrangements and corresponding similar sensor arrangements.

According to a second aspect of the invention there is provided a method of aligning a source module and an illuminator of a lithographic apparatus, the source module including a collector configured to collect radiation from a radiation emitting plasma; the illuminator configured to condition the radiation collected by the collector and to provide a radiation beam; the lithographic apparatus further comprising:

an actuator; and a detector arrangement comprising a reflector arrangement disposed in a fixed positional relationship with respect to the illuminator; and a sensor arrangement disposed in a fixed positional relationship with respect to the reflector arrangement; the method comprising the sensor arrangement measuring at least one property of radiation reflected by the reflector, the detector arrangement determining the location of a far field position of the radiation as a function of at least one property of the radiation reflected by the reflector and measured by the sensor arrangement; comparing the location of the far field position measured by the detector arrangement to a target far field position; and the actuator producing a relative movement between at least part of the source collector module and at least part of the illuminator to move the location of far field position toward the target far field position.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 9 is a schematic view of a reflector arrangement which forms part of a third detector arrangement;

FIG. 10 is a schematic view of a third detector arrangement having the reflector arrangement shown in FIG. 9;

DETAILED DESCRIPTION

Figure 1:
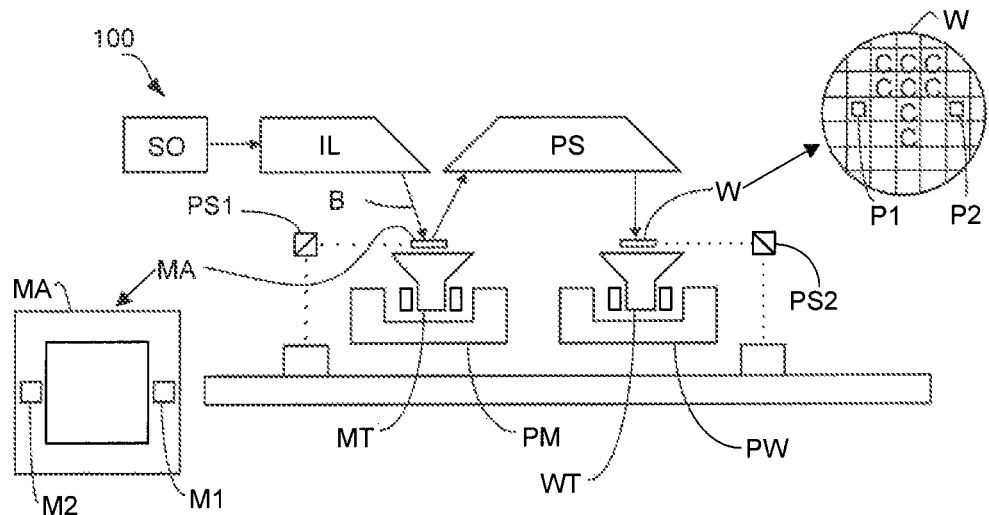
FIG. 1 depicts a lithographic apparatus according to an embodiment of the invention.

FIG. 1 schematically depicts a lithographic apparatus 100 according to an embodiment of the invention including a source collector module SO according to one embodiment of the invention. The apparatus comprises:
- an illumination system (illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
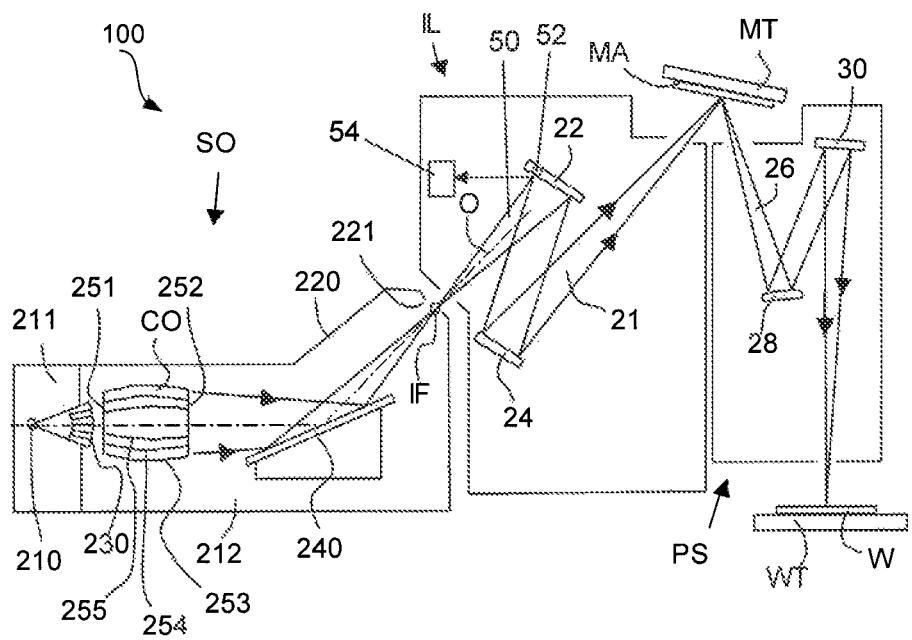
FIG. 2 is a more detailed view of part of the lithographic apparatus of FIG. 1, including a DPP source collector module SO.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting a very hot plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the very hot plasma 210 is passed from a source chamber 211 into a collector chamber 212 via an optional gas barrier or contaminant trap 230 (in some cases also referred to as contaminant barrier or foil trap) which is positioned in or behind an opening in the source chamber 211. The contaminant trap 230 may include a channel structure. Contamination trap 230 may also include a gas barrier or a combination of a gas barrier and a channel structure. The contaminant trap or contaminant barrier 230 farther indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210. A cone of radiation 50 extends from the intermediate focus IF into the illumination system IL.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

The illumination system IL comprises a reflector arrangement 52 mounted to the facetted field mirror device 22, and a sensor arrangement 54. The reflector arrangement 52 directs a portion of the cone of radiation 50 towards the sensor arrangement 54.

The collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
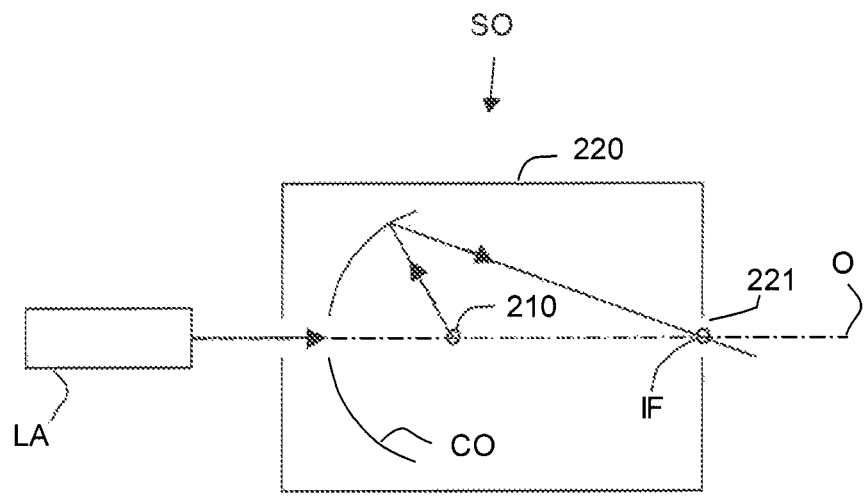
FIG. 3 is a view of an alternative source collector module SO of the apparatus of FIG. 1, the alternative being a LPP source collector module.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a new normal incidence collector optic CO and focused onto the opening 221 in the enclosing structure 220.

Figure 4:
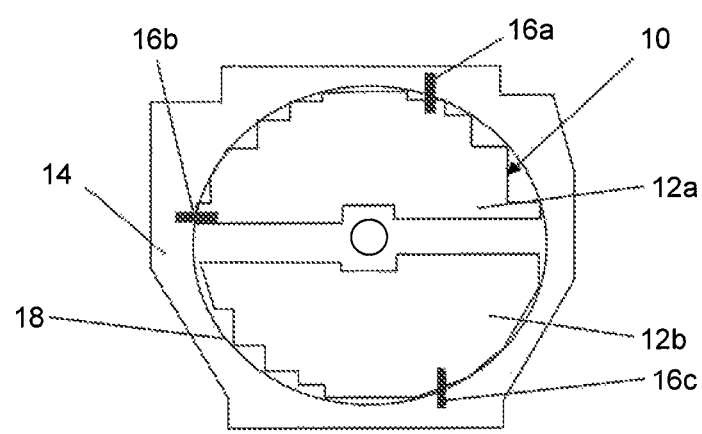
FIG. 4 is a schematic view of the front of a known reflector which may form part of an illuminator of a known lithographic apparatus.

FIG. 4 shows a face-on view of a known reflector which may form a first reflector which radiation entering the illuminator of a known lithographic apparatus encounters. For example, the reflector 10 may form the facetted field mirror device 22 in a lithographic apparatus similar to that shown in FIG. 2. Returning to FIG. 4, the reflector 10 comprises two reflective portions 12a, 12b which reflect the radiation incident on them from the source collector module. The reflective portions 12a, 12b are arranged such that together they form a generally circular shape. The reflective portions may each comprise a plurality of reflector elements (not shown). A support frame 14 is mounted within the illuminator and is located in a fixed positional relationship with respect to the reflective portions 12a and 12b. For example, the support frame 14 may be adjacent the reflective portions 12a and 12b. The support frame 14 may be located such that in use it is upstream of the reflector portions 12a, 12b with respect to the radiation which passes though the illuminator. The support frame is commonly formed from a rigid, dense material which is less reflective of the radiation incident on the reflector 10 than the reflective portions 12a, 12b. The support frame 14 may for instance be constructed from metal. Three similar sensors 16a, 16b, 16c are attached to the support frame 14. The sensors 16a, 16b, 16c are approximately equi-angularly spaced around the reflector 10. The sensors 16a, 16b, 16c may be one dimensional sensors. The sensors detect the amount of radiation which is incident at different positions along their length. Such sensors may be referred to as edge detection sensors. A circle 18 illustrates the position of the outer edge of radiation incident on the reflector 10 from the source collector module. It can be seen that the edge 18 of the radiation passes through each of the sensors 16a, 16b, 16c. Each of the sensors 16a, 16b, 16c is capable of detecting the position of the edge of the radiation.

The output of the sensors 16a, 16b and 16c may be used to determine the size of the projection of the cone of radiation incident on the reflector 10, the shape of the projection of the cone of radiation incident on the reflector, and the position of the projection of the cone of radiation incident on the reflector 10. It follows that the output of the sensors 16a, 16b and 16c may be used to determine the size, shape and position of the far field. This information may then be used to determine the far field position. For example, the far field position may be the geometric center of the far field. Because the far field is a projection of the radiation beam, if the source of the radiation beam (e.g., the source collector module SO) moves relative to the plane onto which the far field is projected (e.g., the facetted field mirror 22 of the illuminator IL) then the location of the far field (and hence the far field position) will change. For example, the location of the far field on the facetted field mirror will change. It follows that the output of the sensors 16a, 16b and 16c relating to the size, shape and position of the far field is a function of the alignment between the source collector module SO and illuminator IL. The output of the sensors 16a, 16b and 16c relating to the far field (and the far field position) can thus be used to ensure that the alignment between the source collector module SO and illuminator IL is correct by ensuring that the far field (and hence the far field position) is located within certain boundaries. Ensuring that the alignment between the source collector module SO and illuminator IL is correct may improve the operating performance of the illuminator (and hence the imaging performance and/or throughput of the lithographic apparatus).

As previously discussed, the source collector module of the lithographic apparatus produces a cone of radiation which is directed into the illuminator. It is common for the illuminator to comprise a plurality of reflectors (including, for example, a facetted field mirror) which co-operate to direct radiation to the patterning device. In such lithographic apparatus it is important that the alignment of the source collector module and the illuminator, and hence the far field position, is correct. Two reasons for this are as follows. First, if the far field position (and hence the direction from which radiation is incident on the illuminator) is incorrect, the alignment of the plurality of reflectors within the illuminator may no longer be capable of directing some of the radiation to the patterning device. Secondly, if the far field position is incorrect, the intensity distribution of radiation which is incident on the patterning device (and hence the substrate) may be incorrect. In some lithographic apparatus it is desirable that the center of the cone of radiation produced by the source collector module is incident on the center of any reflectors within the illuminator (and hence on the center of the patterning device and substrate). This is because, in the case where the reflective portions 12a, 12b each comprise a plurality of reflector elements, the interaction of the reflector elements is optimized for the far field position (which in this case is the position of the center of the image of the radiation beam incident on the reflector 10) being located at substantially the center of the reflector 10. It may also be advantageous in some lithographic apparatus for the source collector module and the lithographic apparatus to be aligned in order that the far field position is such that the edge of the cone of radiation produced by the source collector module generally aligns with the edge of the reflectors of the illuminator. This may be advantageous because, by ensuring the edge of the cone of radiation generally aligns with the edge of the reflectors of the illuminator, this substantially prevents radiation produced by the source collector module from falling outside of the reflectors. By substantially preventing radiation falling outside of the reflectors, this minimizes the amount of radiation which is lost as the radiation beam travels through the illuminator to the patterning device. By minimizing the amount of radiation lost as the radiation beam travels through the illuminator, the amount of radiation which can be used to create an image on the substrate is maximized, which may improve the imaging performance and/or throughput of the lithographic apparatus.

Some lithographic apparatus may comprise a reflector within the illumination system (such as a facetted field mirror device) which is of significant size. The use of such a large reflector may make using a support frame disadvantageous. This is because a larger reflector necessitates a larger support frame. This is because the sensors mounted to the support frame must be located at positions which correspond to the outer edge of the reflector. Due to the fact that the support frame is commonly made from a dense material, the use of a large support frame may mean that the support frame is both cumbersome and heavy. The use of more material in order to make a support frame may also increase the cost of such a support frame. It follows that in the case of a large reflector, it may be advantageous for it not to have a support frame. In the situation where a reflector does not have a support frame, it is not possible to locate the edge detection sensors around the reflector on the support frame.

The present invention seeks to provide an alternative way of determining the far field position without the use of edge detection sensors located on a support frame adjacent a reflector (such as a facetted field mirror device) within the illuminator. By avoiding the use of sensors located on a support frame, the support frame can be omitted, thus making the illuminator of the lithographic apparatus lighter and less expensive to produce.

Figure 5:
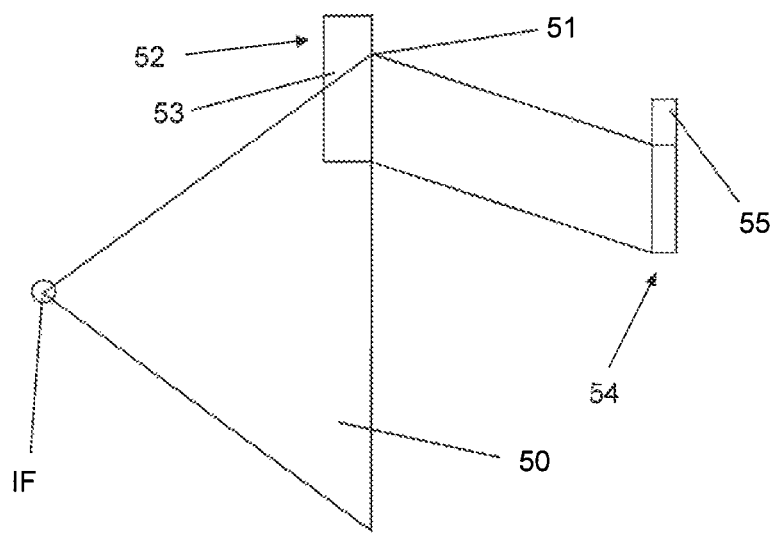
FIG. 5 is a schematic view of a first detector arrangement shown relative to an intermediate focus, the first detector arrangement forming part of the lithographic apparatus shown in FIG. 1.

FIG. 5 shows a schematic representation of an arrangement which forms part of an embodiment of the present invention. The cone of radiation which is produced by the source collector module of the lithographic apparatus and is downstream of the intermediate focus IF is indicated as 50. The edge 51 of the radiation cone 50 is incident on a reflector arrangement 52. In this case the reflector arrangement comprises a planar mirror 53. The planar mirror 53 is mounted on the facetted field mirror device of the illuminator. In some embodiments the first reflector that the radiation is incident on within the illuminator may comprise a plurality of facetted field mirror devices which are mounted to a support structure. In these embodiments, the planar mirror 53 may be mounted to the support structure. It will be appreciated that in other embodiments, a planar mirror 53 (and hence the reflector arrangement 52) may be attached to any appropriate part of the illuminator (for example to another reflector within the illuminator) such that the reflector arrangement is disposed in fixed positional relationship with respect to the illuminator. Due to the fact that the reflector arrangement is in a fixed positional relationship with respect to part of the illuminator (e.g., the facetted field mirror), any movement of the illuminator (and in particular the part of the illuminator with which the reflector arrangement is in a fixed positional arrangement) will result in the same movement of the reflector arrangement. For this reason, measuring the movement of the reflector arrangement is equivalent to measuring the movement of the illuminator (and in particular the part of the illuminator with which the reflector arrangement is in a fixed positional arrangement).

The reflector arrangement 52 directs the radiation reflected by the reflector arrangement 52 towards a sensor arrangement 54. In this case the sensor arrangement 54 comprises a one dimensional edge detection sensor 55. Because the reflector arrangement 52 is in a fixed positional relationship with at least part of the illuminator, measurement by the sensor arrangement 54 of radiation reflected by the reflector arrangement is indicative of the position of the illuminator. Furthermore, the sensor arrangement 54 is in a fixed positional relationship with respect to the reflector arrangement. This ensures that the radiation measured by the sensor arrangement is a function of the location of the far field (and hence the relative positioning of the source collector module and the illuminator) and not of any change in relative position between the reflector arrangement and the sensor arrangement.

When the location of the far field (and hence the far field position) changes, the position of the edge 51 of the radiation cone 50 changes. Consequently, the position of the edge of the radiation which is reflected by the reflector arrangement 52 and incident on the sensor arrangement 54 also changes. This allows the detector arrangement (which comprises the reflector arrangement 52 and the sensor arrangement 54) to measure the location of the tar field and hence determine the far field position.

Figure 6:
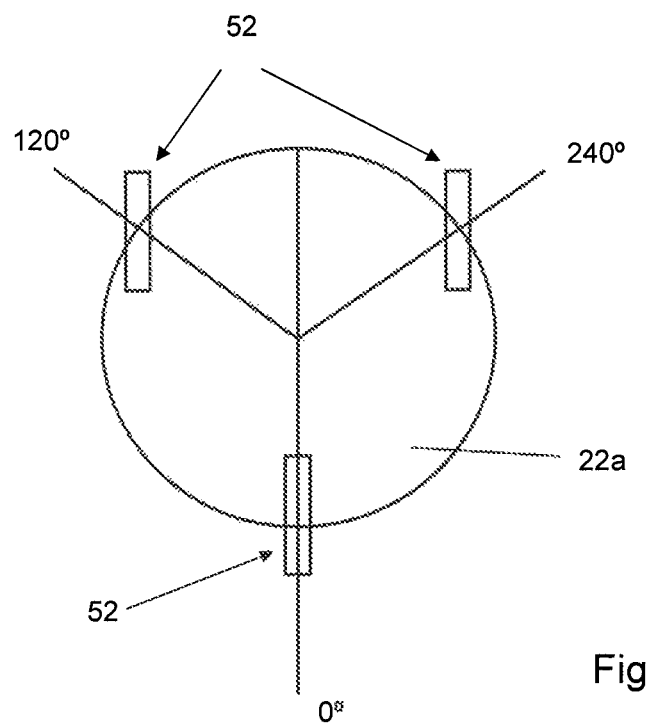
FIG. 6 is a schematic view of a second detector arrangement mounted to a reflector, the second detector arrangement comprising a plurality of the detector arrangements as shown in FIG. 5.

FIG. 6 shows an example of a detector arrangement which comprises three similar reflector arrangements 52. The reflector arrangements 52 are attached to the reflector 22a at azimuthal positions of 0 degrees, 120 degrees and 240 degrees within the plane of the reflector 22a. It will be appreciated that any appropriate number of reflector arrangements could be used as part of a detector arrangement according to the present invention. Similarly, the or each reflector arrangement may have any appropriate position (or relative positioning) around the reflector 22a.

It will be appreciated that the use of a reflector arrangement which couples information about the far field to a sensor arrangement which is remote to the reflector to which the reflector arrangement is attached, means that the sensor arrangement can be located in any appropriate position. This is because the reflector arrangement can be positioned and tilted so as to direct the radiation reflected by it to any appropriate location. For example, the sensor arrangement may be inside the illuminator or outside the illuminator, providing that there is a fixed positional relationship between the sensor arrangement and the reflector arrangement. Due to the fact that the sensor arrangement can be located at a position away from the reflector (e.g., facetted field mirror device) of the illuminator, no support frame of similar size to the reflector is required in proximity to the reflector to support the sensor arrangement. The ability to omit the support frame from the illuminator means that the illuminator can be constructed so that it is smaller. Furthermore, the an illuminator which does not have a support frame will be cheaper and less heavy, due to the expensive and dense nature of the support frame material. In a case where the support frame is integral with the reflector, the omission of a support frame will make such a reflector smaller in size, lighter and cheaper to manufacture. For example, a reflector without a support frame, having the same reflective area as a reflector with an integrated support frame, will be capable of being mounted in a smaller space than a reflector with an integrated support frame.

As previously discussed, the planar mirror 53 and one dimensional sensor 55 measure the position of the edge of the cone of radiation produced by the source collector module, thereby allowing the location of the far field position (and hence the far field position) to be determined. However, this combination of reflector arrangement 52 and sensor arrangement 54 has some properties which may be disadvantageous in some applications of the present invention. These properties are discussed below.

Figure 7:
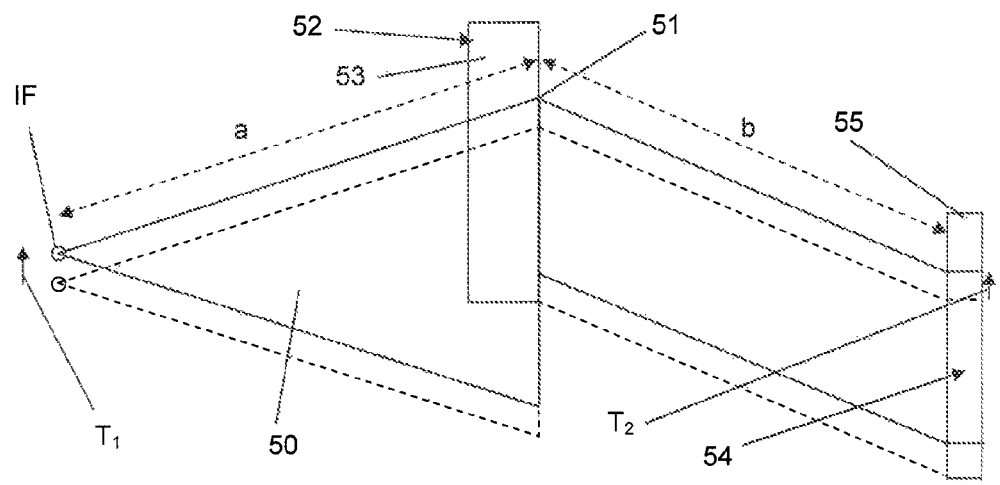
FIG. 7 is a schematic view showing the effect of a translation in far field position on the detector arrangement shown in FIG. 5.
Figure 8:
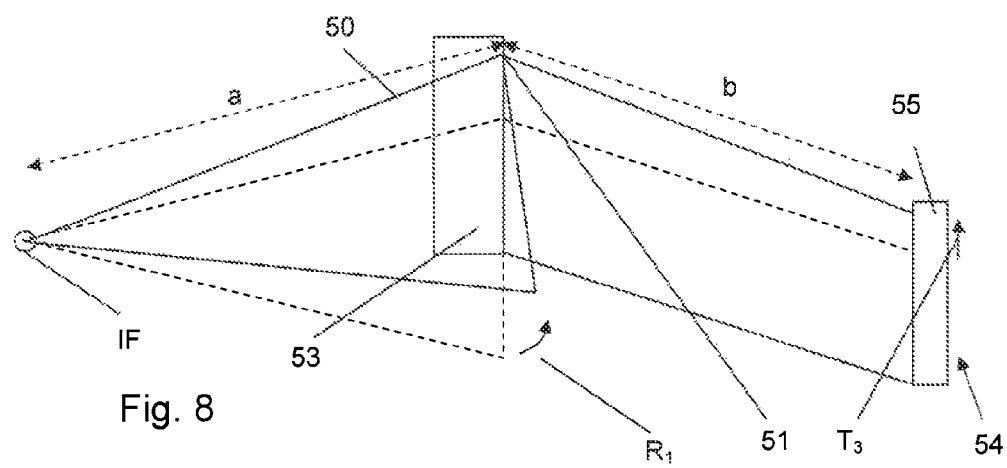
FIG. 8 is a schematic view showing the effect of a tilt in far field position on the detector arrangement shown in FIG. 5.

FIGS. 7 and 8 show schematic diagrams of the effect of different relative movements between the source collector module (not shown) and the illuminator on the far field. The figures also show the effect of the different relative movements between the source collector module and the illuminator on the radiation reflected by the reflector arrangement 52 (shown in FIG. 5) and hence on the position of the edge of the radiation measured by the sensor arrangement 54. FIG. 7 shows a linear translation of the far field (for example by translating the source collector module of a lithographic apparatus relative to the illuminator). FIG. 8 shows another movement of the far field due to a tilt between the source of the radiation beam and the plane onto which the far field is projected (for example, by tilting the source collector module relative to the illuminator about the intermediate focus IF). In both FIGS. 7 and 8, the illuminator comprises the reflector arrangement 52 and the sensor arrangement 54.

In more detail, FIG. 7 shows that the translation of the source collector module relative to the illuminator causes the cone of radiation 50 and the intermediate focus IF to move from an initial position (indicated by dashed lines) to a translated position (indicated by solid lines). The translation of the intermediate focus and cone of radiation 50 is indicated by $T_1$. The translation $T_1$ of the intermediate focus IF and cone of radiation 50 causes the edge 51 of the radiation cone which is incident on the planar mirror 53 to translate. This results in the position of the edge detected by the sensor 55 also translating. The translation of the position of the edge detected by the sensor 55 is indicated by $T_2$. Because the translation $T_1$ is parallel to the plane of the mirror 53, the length of the translation $T_2$ detected by the sensor 55 is equal to the length of the translation $T_1$. For example, a translation $T_1$ of the source collector module relative to the illuminator of 1 mm will produce a translation $T_2$ of 1 mm at the sensor 55.

FIG. 8 shows a tilt between the source collector module and the illuminator about the intermediate focus IF. The radiation cone produced by the source collector module before the tilt is indicated by dotted lines. The tilting of the source collector module relative to the illuminator about the intermediate focus is indicated by $R_1$ and results in movement of the cone of radiation 50 to the position indicated by solid lines. A relative tilt between the source collector module and the illuminator about the intermediate focus IF causes the location of the far field (and hence the far field position) to move. This movement of the location of the far field is indicated by the movement of the edge 51 of the cone 50 of radiation which is incident on the planar mirror 53. This in turn causes the edge of the cone of radiation which is reflected by the planar mirror 53 and incident on the sensor 55 to translate. This translation is shown by $T_3$. For a relative tilt between the source collector module and the illuminator of 1/a mrad about the intermediate focus IF there will be a translation $T_3$ at the sensor 55 of 1+(b/a) mm. In the above expressions, a is the distance between the intermediate focus IF and the edge 51 of the cone of radiation 50 which is incident on the planar mirror 53 and b is the distance between the edge 51 of the cone of radiation 50 which is incident on the mirror 53 and the point at which the edge 51 reflected by the mirror 53 is incident on the sensor 55. For clarity, FIGS. 7 and 8 only indicate the distances a and b before the translation (FIG. 7) and tilt (FIG. 8).

As shown in FIGS. 7 and 8, both a relative translation and a relative tilt between the source collector module and the illuminator result in a movement of the far field which causes a translation of the reflected edge of the cone of radiation detected by the sensor 55. Because of this it may not be possible (using the reflector arrangement 52 and sensor arrangement 54 of this embodiment) to distinguish between a movement of the far field (and hence the far field position) which is due to a relative translation between the source collector module an the illuminator and a movement of the far field which is due to a relative tilt between the source collector module and the illuminator. For example, if the sensor arrangement 54 provides an output that the far field position is 2 mm away from a target position, this may be due to a translation between the source collector module and the illuminator which is 2 mm from a target alignment between the source collector module and illuminator. Alternatively, an output of the sensor arrangement 54 that the far field position is 2 mm away from a target position may be due to a relative tilt between the source collector module and the illuminator of (if a=b=1 m) 1 mrad about the intermediate focus IF from a target alignment between the source collector module and the illuminator. Alternatively, the measured deviation of the far field position from the target position may be due to a combination of a relative translation between the source collector module and the illuminator, and a relative tilt between the source collector module and illuminator.

In some lithographic apparatus it may be desirable to be able to move the far field position in response to the output of the sensor arrangement 54 (e.g., for alignment purposes). This may be achieved, for example, by translating or tilting the source collector module relative to the illuminator. When using the reflector arrangement 52 and sensor arrangement 54 of this embodiment it may not be possible to distinguish between a deviation of the far field position from a target position due to a relative translation between the source collector module and the illuminator away from a target alignment, and a deviation of the far field position from a target position due to a relative tilt between the source collector module and the illuminator away from the target alignment. Because of this it may not be possible to use the sensor arrangement 54 to determine whether (and to what extent) the source collector module and illuminator have been translated and/or tilted relative to one another away from the target alignment, and hence what relative translation and/or tilt between the source collector module and the illuminator is required to compensate for the deviation of the far field position from the target position.

It should be noted that in some lithographic apparatus it may not be desirable to compensate for a deviation in the far field position from the target position by translating the source collector module relative to the illuminator. For example, separate alignment systems within a lithographic apparatus may fix the position of the intermediate focus (e.g., at an entrance aperture of an illuminator). In this case it may not be possible to translate the source collector module relative to the illuminator because the position of the intermediate focus is fixed. Instead, a deviation in the far field position from a target position due to both relative translation and relative tilt between the source collector module and illuminator may be compensated for by tilting the source collector module relative to the illuminator about the intermediate focus. The position of the intermediate focus IF thus remains constant.

FIGS. 9 and 10 show a reflector arrangement and detector arrangement respectively which may form part of a further embodiment of the invention.

The reflector arrangement 52 shown in FIGS. 9 and 10 comprises a planar mirror having a reflective region 56 and a relatively unreflective region 57. The relatively unreflective region 57 may be substantially unreflective of radiation from the source collector module of the lithographic apparatus which is incident upon it in use. The relatively unreflective region 57 may be substantially unreflective of the incident radiation due to a relatively high absorbance and/or transmittance of incident radiation. In some embodiments the relatively unreflective region 57 may comprise a coating of a substantially black material. It can be seen within the figures that the relatively unreflective region 57 covers the lower portion of the planar mirror and the relatively unreflective region 57 defines an isolated reflector region 58 at the base of the planar mirror. In this instance, the isolated reflector region 58 is a generally small circular mirror portion (despite the fact that it is shown in the figures as a square) which may be created by not coating a portion of the base of the planar mirror with a substantially black material. The reflective region 56 reflects a greater proportion of the radiation incident on it compared to the relatively unreflective region 57. It will be appreciated that although the reflective region 56, relatively unreflective region 57 and isolated reflector region 58 are described as forming part of a single reflector, this need not be the case. The reflective region 56, relatively unreflective region 57 and isolated reflector region 58 may be formed separately. For example, the reflective region 56 and isolated reflector region 58 may be formed from separate reflectors, which are separated by the relatively unreflective region 57. For example, the relatively unreflective region may be formed by a volume of air or by a volume of vacuum.

FIG. 10 shows a detector arrangement having both the reflector arrangement 52 shown in FIG. 9 and a sensor arrangement 54. The sensor arrangement 54 comprises a one dimensional edge detection sensor 59. It can been seen that, in use, the cone of radiation 50 which is produced by the source collector module is incident on the reflector arrangement 52 such that the edge 51 of the cone of radiation 50 falls on the reflective region 56 of the planar mirror. The edge 51 of the cone of radiation 50 is reflected by the reflective region 56 such that it is incident on the one dimensional edge detection sensor 59. The edge detection sensor 59 operates in a similar manner to that in the embodiment shown in FIG. 5. The sensor 59 detects the amount of radiation which is incident at different positions along its length and determines the position of the edge of the cone of radiation 50.

Part of the cone of radiation 50 is incident on the isolated reflector region 58 of the planar mirror. The isolated reflector region 58 reflects the incident radiation onto a two dimensional sensor 60. The two dimensional (2d) sensor 60 and one dimensional (1d) sensor 59 both form part of the sensor arrangement 54. The 2d sensor 60 may be, for example, a two dimensional position sensitive device (2d PSD) or a two dimensional charged coupled device (2d CCD). The output of a 2d PSD may be such that it is representative of the average center of the power distribution of radiation incident upon it. If the isolated reflector region 58 is such that radiation reflected by it and imaged on a 2d PSD has a power distribution, the average center of which corresponds to the geometric center of the isolated reflector region 58, then the output of the 2d PSD will correspond to the geometric center of the image of the isolated reflector region 58. The output of a 2d CCD may be such that it provides an indication of the power of radiation which is incident upon each individual pixel of the device. An output of the 2d CCD may be supplied to a processor which analyses the power distribution of the radiation incident on it and determines the center of the image of the isolated reflector region incident on the 2d CCD. In this case the power distribution of the radiation imaged on the 2d CCD may not need to have a center that corresponds with the geometric center of the image of the isolated reflector region which is incident on the 2d CCD.

The 1d sensor 59 of the sensor arrangement 54 responds to a movement of the far field (and hence the far field position) due to a relative translation and or tilt between the source collector module and the illuminator in an equivalent manner to the response of the one dimensional sensor of FIG. 5, which is discussed above. It follows that if there is a relative translation between the source collector module and the illuminator by, for example, 1 mm, then the 1 dimensional sensor 59 will measure a 1 mm translation in the position of the edge of the radiation reflected by the reflector arrangement 52 which is incident upon it. Furthermore, for every 1/a mrad relative tilt between the source collector module and the illuminator about the intermediate focus IF the one dimensional sensor 59 will measure a 1+(b/a) mm shift in the position of the edge of the radiation reflected by the reflector arrangement 52 which is incident upon it.

The radiation reflected by the isolated reflector region 58 of the planar mirror does not change the position at which it is incident on the two dimensional sensor 60 of the sensor arrangement 54 if the far field location is moved by a relative tilt between the source collector module and illuminator (e.g., about the intermediate focus IF). Instead, the position of the radiation incident on the two dimensional sensor 60 which has been reflected by the isolated reflector region 58 changes if the far field location is moved by a relative translation between the source collector module and the illuminator.

The one dimensional sensor 59 has an output which is a function of the movement of the location of the far field due to both relative translation and relative tilt between the source collector module and the illuminator. The output of the two dimensional sensor 60 is a function of movement of the location of the far field position due to relative translation (but not relative tilt) between the source collector module and the illuminator. Because of the previously discussed nature of the outputs of the one dimensional sensor and of the two dimensional sensor it is possible to compare both outputs to determine and separate any measured movement of the location of the far field (and hence the far field position) due to a relative translation between the source collector module and the illuminator, and due to a relative tilt between the source collector module and the illuminator. This may be achieved as described below:

The two dimensional sensor 60 is used to measure the movement of the far field (and hence the far field position) due to relative translation between the source collector module and the illuminator. The one dimensional sensor 59 provides an output which is a function of the movement of the far field (and hence the far field position) due to both relative translation and relative tilt between the source collector module and the illuminator. Processing of the output of the one dimensional sensor 59 is carried out to remove any contribution to the output of the one dimensional sensor 59 which is due to relative translation between the source collector module and illuminator (as determined by the output of the two dimensional sensor 60). The remaining component of the output from the one dimensional sensor 59 will therefore only be representative of any movement in the location of the far field position which is due to relative tilt between the source collector module and the illuminator.

By determining the individual translation and tilt contributions to a deviation of the far field position from a target position, the relative movement between the source collector module and illuminator that is required to correct said deviation in the far field position can be determined. Relative movement between the source collector module and illuminator may be accomplished by moving at least part of the source collector module and/or at least part of the illuminator, e.g., by the use of one or more actuators. As previously mentioned, it may not be possible to translate the position of the source collector module (and hence the intermediate focus) relative to the illuminator because the position of the intermediate focus may need to be fixed. Instead, it may be the case that any deviation of far field position from a target position (e.g., as a result of relative translation and/or tilt between the source collector module and the illuminator) may be compensated for by tilting the source collector module relative to the illuminator (or vice versa) about the intermediate focus.

An example of the operation of the detector arrangement shown in FIG. 10 is given below.

In this example the length a (between the intermediate focus IF and the reflector arrangement 52) and the length b (between the reflector arrangement 52 and the one dimensional sensor 59) are both equal to one another, for example they are both equal to 1 m. The one dimensional sensor 59 measures a 6 mm shift of the image of the edge of the cone of radiation reflected on to the sensor 59 (due to movement of the location of the far field) and the two dimensional sensor 60 measures a 2 mm shift in the position of the image of the isolated reflector portion reflected on to the sensor 60. Based on the shift measured by the two dimensional sensor 60 it is known that there has been a 2 mm relative translation between the source collector module and the illuminator (due to the fact that for every 1 mm relative translation between the source collector module and the illuminator, the two dimensional sensor measures a shift of b/a mm—in this case 1 mm). It is known that there has been a relative translation between the source collector module and the illuminator of 2 mm (as determined by the two dimensional sensor). It is also known that the one dimensional sensor 59 measures a shift of 1 mm per 1 mm relative translation between the source collector module and the illuminator. It follows that of the 6 mm shift measured by the one dimensional sensor 59, 2 mm of this was due to a relative translation between the source collector module and the illuminator and therefore 4 mm of the shift is due to a relative tilt between the source collector module and the illuminator. The one dimensional sensor 59 experiences a shift of 1+(b/a) mm per 1/a mrad relative tilt between the source collector module and the illuminator. It follows that there has been a relative tilt between the source collector module and the illuminator of 2 mrad. In order to realign the far field position with the target position (to compensate for the movement it has undergone), a 2 mrad relative tilt between the source collector and the illuminator must be compensated for as well as a 2 mm relative translation between the source collector and the illuminator. If it is only possible to compensate for the relative translation and tilt between the source collector and the illuminator by a relative tilt between the source collector and the illuminator about the intermediate focus IF (i.e., without translating the source collector module (and hence the intermediate focus IF) relative to the illuminator) then this may be achieved as follows. The 2 mrad tilt component of the movement of the far field position can be compensated for by applying an equal relative tilt between the source collector module and the illuminator (about the intermediate focus IF) of −2 mrad. The direction of the relative tilt applied between the source collector module and the illuminator will be opposite to the direction of relative tilt which caused the shift in the far field position measured by the two dimensional sensor 60. To compensate for the 2 mm translation component of the movement of the far field position a relative tilt between the source collector and the illuminator (about the intermediate focus IF) of −2 mrad is required. Again, the direction of the relative tilt applied between the source collector module and the illuminator will be such as to cause a movement of the far field position which is opposite to the translation component of the movement of the far field position measured by the sensor arrangement. In this way the tilt of −2 mrad will produce a −2 mm shift of the far field position, which counteracts the 2 mm translation measured by the sensor arrangement. Hence, to compensate for the 2 mm relative translation between the source collector and the illuminator and the 2 mrad relative tilt between the source collector and the illuminator, a total relative tilt between the source collector and the illuminator (about the intermediate focus IF) of −4 mrad is required.

If a plurality of reflector arrangements 52 and corresponding sensor arrangements 54 according to that shown in FIG. 10 are mounted to a reflector within the illuminator, then it may be possible to use the detector arrangement (which comprises the plurality of reflector arrangements and corresponding sensor arrangements) to measure not only the far field position (as described above), but also the position of the intermediate focus IF.

If three corresponding reflector arrangements and sensor arrangements according to that shown in FIG. 10 are arranged around a reflector of the illuminator (for example a facetted field mirror) in a similar manner to that shown in FIG. 6 then the detector arrangement may be able to determine additional information about the optical system. For example, the detector arrangement may be able to determine the position of the radiation emitting plasma relative to the collector.

It will be appreciated that the use of the same planar mirror to provide the input for two separate sensors (i.e., the one dimensional sensor 59 and two dimensional sensor 60) may offer cost benefits compared to the use of two separate mirrors/reflectors. However, it will be appreciated that it is within the scope of the invention for a separate mirror/reflector to be used to direct radiation to each sensor. The use of a single mirror/reflector to direct radiation to both the one dimensional sensor 59 and two dimensional sensor 60 may be advantageous in that it facilitates easy calibration of both sensors simultaneously. Calibration of the sensors occurs whereby the position and orientation of the reflector arrangement (relative to the reflector to which the reflector arrangement is mounted) and the position and orientation of the sensors of the sensor arrangement are adjusted so that an output of each of the sensors of the sensor arrangement is a desired output when the far field is at a target position. In the case of using a single reflector (i.e., which has a reflective region and a isolated reflector region) to direct radiation to both the one dimensional sensor 59 and two dimensional sensor, providing that the one dimensional sensor 59 and two dimensional sensor 60 are well aligned with respect to one another, if the one dimensional sensor is calibrated with the reflector arrangement 52, then the two dimensional sensor 60 will also be calibrated with respect to the reflector arrangement 52 (or vice versa).

Figure 11:
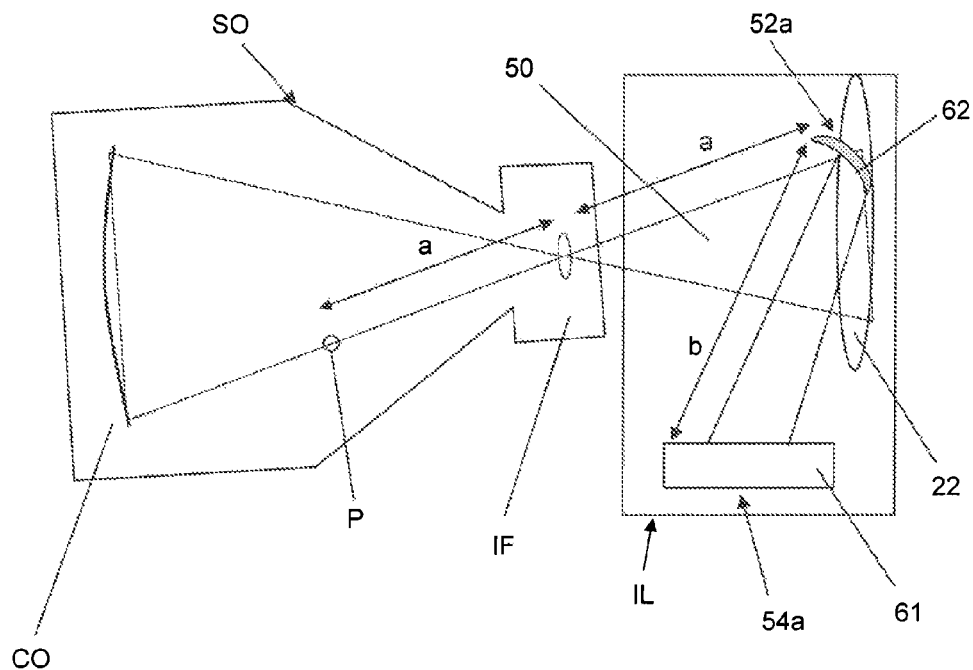
FIG. 11 is a schematic view of part of a lithographic apparatus comprising a fourth detector arrangement.

FIG. 11 shows a schematic view of part of a lithographic apparatus having a detector arrangement according to a further embodiment of the present invention. The source collector module SO comprises a collector CO configured to collect radiation from a radiation emitting plasma (not shown) and direct the collected radiation towards the illuminator IL. The radiation which is directed by the collector CO towards the illuminator IL passes through an intermediate focus IF and forms a cone of radiation 50 within the illuminator. The cone of radiation 50 is directed at a reflector within the illuminator. In this case, the reflector is a facetted field mirror 22. A reflector arrangement 52a is mounted on the facetted field mirror 22. The edge of the cone of radiation 50 is incident on the reflector arrangement 52 and the reflector arrangement 52a reflects radiation incident upon it towards the sensor arrangement 54a. The sensor arrangement 54a comprises a one dimensional sensor 61.

The reflector arrangement 52 comprises a curved reflector 62. The curved reflector may be a curved mirror. The detector arrangement of this embodiment of the invention operates in an equivalent manner to a sensor arrangement shown in FIG. 5. The reflector arrangement 52 reflects the edge of the cone of radiation 50 on to the one dimensional sensor 61. The one dimensional sensor 61 can determine the position (along its length) of the reflected edge. The position of the reflected edge of the cone of radiation along the one dimensional sensor, which is detected by the one dimensional sensor 61, is a function of the far field position.

Unlike the embodiment of the detector arrangement shown in FIG. 5, as mentioned above, the reflector arrangement 52 comprises a curved mirror 62. The curved mirror 62 has a radius of curvature such that a 1/a mrad relative tilt between the source collector module SO and the illuminator IL about the intermediate focus IF causes the same shift in the position of the edge detected by the one dimensional sensor 61 as the shift in edge position which is detected by the one dimensional sensor for a 1 mm relative translation between the source collector module and the illuminator. This characteristic of the detector arrangement may be beneficial as follows.

As previously mentioned, in some lithographic apparatus, movement of the far field position due to both relative translation and tilt between the source collector module and the illuminator may be compensated for by applying a relative tilt between the source collector module SO and the illuminator IL about the intermediate focus IF. For this reason, the process involved in determining how much relative tilt between the source collector module SO and the illuminator should be applied involves first determining the extent to which there has been a movement of the far field position away from a target position due to relative tilt and/or translation between the source collector module and the illuminator. Then, the relative tilt between the source collector module SO and the illuminator IL that is required to compensate for each of the tilt and translation components of the movement of the far field position can be determined. The relative tilt between the source collector module and the illuminator required to compensate for each of the tilt and translation components of the movement of the far field position is then combined and a signal can be supplied to an actuator to effect the required compensatory tilt between the source collector module and the illuminator. Determining the relative tilt between the source collector module SO and the illuminator IL that is required to compensate for a movement in the far field position due to a relative tilt between the source collector module and the illuminator is relatively simple. The relative tilt between the source collector module SO and the illuminator IL required to compensate for a movement of the far field position due to a relative tilt between the source collector module and the illuminator is equal to the relative tilt between the source collector module and the illuminator measured by the detector arrangement, but in the opposite direction. The process is complicated somewhat by having to compensate for movement in the far field position which occurs as a result of relative translation between the source collector module and the illuminator. In this case, the amount of relative translation between the source collector module and the illuminator must first be determined and then a calculation must be performed to determine what relative tilt between the source collector module SO and the illuminator IL will compensate for the translation between the source collector module and the illuminator which has resulted in the movement of the far field position. In the embodiment shown in FIG. 11, the need for this calculation is removed. This is because, due to the curvature of the curved mirror 62, a movement of the far field position due to a relative translation between the source collector module and the illuminator will be detected by the one dimensional sensor 61 as a movement of the far field position due to an 'equivalent tilt' between the source collector module and the illuminator which has an equal magnitude and an opposite direction to that of the relative tilt required between the source collector module SO and the illuminator IL to compensate for the movement of the far field position due to the relative translation between the source collector module and the illuminator. It follows that, in order to compensate for a movement in the far field position due to a relative translation between the source collector module and the illuminator, the source collector module SO and illuminator IL will be tiled relative to one another about the intermediate focus by an amount equal in magnitude and opposite in relative direction to the 'equivalent tilt' between the source collector module and the illuminator detected by the one dimensional sensor. The characteristics of the detector arrangement, and in particular the curvature of the curved mirror that enables the measurement of the 'equivalent tilt' are explained below.

The curved mirror 62 images the point P to the one dimensional sensor 61. The point P is the reflection of the position of the curved mirror 62 in the intermediate focus IF. It follows that the curved mirror 62 (of the reflector arrangement 52) images the reflected far field position to the one dimensional sensor 61 (of the sensor arrangement 54).

The radius of curvature of the curved mirror 62 is chosen such that a movement in the location of the far field due to a 1 mm relative translation between the source collector module and the illuminator will result in a b/2a mm shift in the edge position measured by the one dimensional sensor 61, and a movement in the location of the far field due to a 1/a mrad relative tilt between the source collector module and the illuminator will also result in a shift in the edge position of b/2a mm measured by the one dimensional sensor 61. As previously discussed, a movement of the location of the far field (whether due to a relative translation or relative tilt between the source collector module and the illuminator) which results in a 1 mm shift in the edge position measured by the one dimensional sensor 61 can then be compensated for by a 1/a mrad relative tilt between the source collector module SO and the illuminator IL (about the intermediate focus IF).

The radius of curvature R of the curved reflector 62 can be determined using the following formula:

$$R = \frac{4ab}{(b+2a)} \quad (1)$$

where a is the distance between the intermediate focus IF and the center of curvature of the curved reflector 62 and b is the distance between the center of curvature of the curved reflector 62 and the position on the one dimensional sensor 61 of the sensor arrangement 54 onto which the edge of the cone of radiation is reflected. For example, in the case where the distance is a=b=1 meter, the radius of curvature of the curved reflector 62 is about 1.33 meters.

As previously discussed, the above embodiment may be advantageous in that it removes the requirement of considering the movement of the location of the far field (and hence the far field position) due to relative translation between the source collector module and the illuminator separately from that which is due to relative tilt between the source collector module and the illuminator. The movement of the far field due to relative translation between the source collector module and the illuminator is measured as an 'equivalent tilt' between the source collector module and the illuminator. This 'equivalent tilt' can then be compensated for by a relative tilt between the source collector module SO and the illuminator IL about the intermediate focus IF. This makes this type of the detector arrangement particularly suited to lithographic apparatus in which no translation of the intermediate focus IF is possible (for example, because the position of the intermediate focus needs to be fixed).

Because the curved reflector 62 is a reflector lens it images the reflected far field and hence a reflected far field position (in this case, point P) to the sensor arrangement 54a. This may provide a further advantage. The source collector module SO produces radiation by collecting and directing radiation which is emitted by a radiation emitting plasma (not shown in FIG. 11). The radiation emitted by the radiation emitting plasma is collected and directed by the collector CO. Movement of the radiation emitting plasma relative to the collector CO may cause the far field position to move. The extent to which relative movement between the radiation emitting plasma and the collector CO will affect the measured far field position is dependent on the distance between the far field which is imaged by the reflector on to the sensor arrangement 54a and the collector CO. In the case of the embodiment shown in FIG. 5 the far field that is imaged by the reflector 53 on to the sensor arrangement 54 is the real far field. In this case, the real far field is the cone of radiation 50 which is incident on the reflector 53. In the embodiment shown in FIG. 11, the far field which is imaged by the reflector 62 on to the reflector arrangement 54a is the reflected far field. In this case, the reflected far field is a projection of the radiation beam onto a plane which is the reflection of the reflector 22 in the intermediate focus IF. The part of the reflected far field which is imaged onto the sensor arrangement 54a is indicated by P. Because the distance between the reflected far field (reflection of real far field in intermediate focus) and the collector CO is less than the distance between the real far field and the collector CO, the magnification factor of any movement of the radiation emitting plasma relative to the collector CO imaged at the real far field will be greater than that imaged at the reflected far field. This is because the magnification factor increases with increasing distance from a lens. The lens in this case is the collector CO (which focuses light at the intermediate focus). It follows that because any movement of the radiation emitting plasma relative to the collector CO will be magnified less when measuring the reflected far field, the embodiment shown in FIG. 11 will be less sensitive to movements in the radiation emitting plasma (relative to the collector) than the embodiment shown in FIG. 5. This means that the output of the detector arrangement of the embodiment shown in FIG. 11 may be more accurate that the detector arrangement shown in FIG. 5 when aligning the source collector module SO and illuminator IL.

Figure 12:
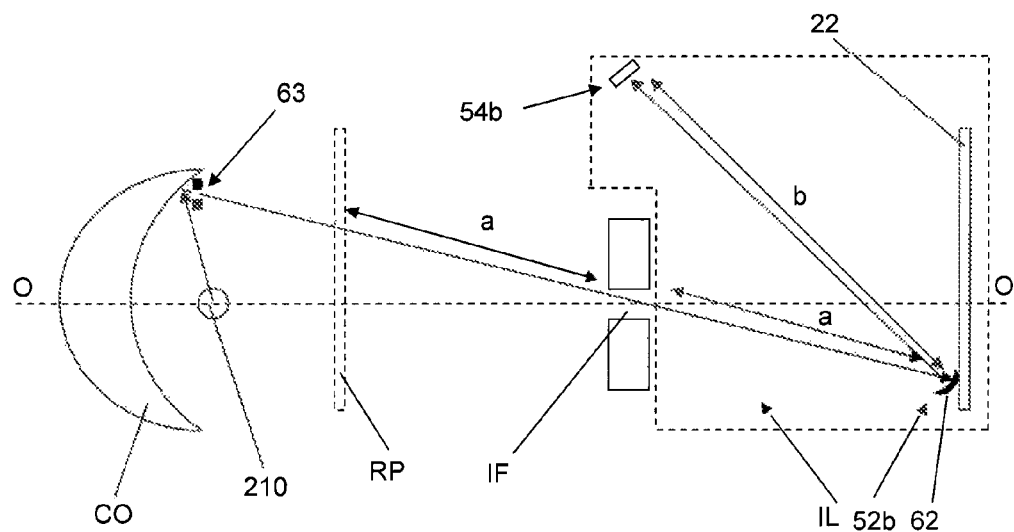
FIG. 12 is a schematic view of part of a lithographic apparatus comprising a fifth detector arrangement.

FIG. 12 shows a schematic diagram of a further possible embodiment of the invention. The previous embodiments have all imaged the edge of the cone of radiation produced by the collector CO to the sensor arrangement in order to determine the far field position. This may be undesirable in some applications. The edge of the cone of radiation produced by the collector may in some cases have an intensity profile which is not a perfect step function. That is to say that the cone of radiation within the edge may not have a uniform intensity which decreases instantaneously to zero at the edge as you move radially outwards. Instead, the intensity of the radiation may be generally uniform at a location radially within the edge, but may decrease at the edge over a finite distance to zero as you travel radially outwards. The exact profile of the intensity of the edge of the cone of radiation as a function of radius is not well understood. It may therefore be desirable in some embodiments to detect the far field position using a portion of the cone of radiation other than its edge.

FIG. 12 shows a radiation emitting plasma 210 and a collector CO which collects the radiation emitted by the radiation emitting plasma and directs it towards the illuminator IL. The radiation which is directed by the collector CO towards the illuminator IL is incident on a facetted field mirror 22 of the illuminator IL via an intermediate focus IF. The reflector arrangement 52b comprises a curved mirror 62 (which is equivalent to the curved mirror of the previously discussed embodiment) that is mounted to the facetted field mirror 22. The curved mirror 62 images part of the reflected far field (which lies on the reflected plane RP) to a detector arrangement 54b which forms part of the illuminator and is in a fixed positional relationship with respect to the reflector (curved mirror) 62 of the reflector arrangement 52b. As before, the reflected plane RP (in which the reflected far field exists) is a reflection of the facetted field mirror 22 in the intermediate focus IF.

Figure 13:
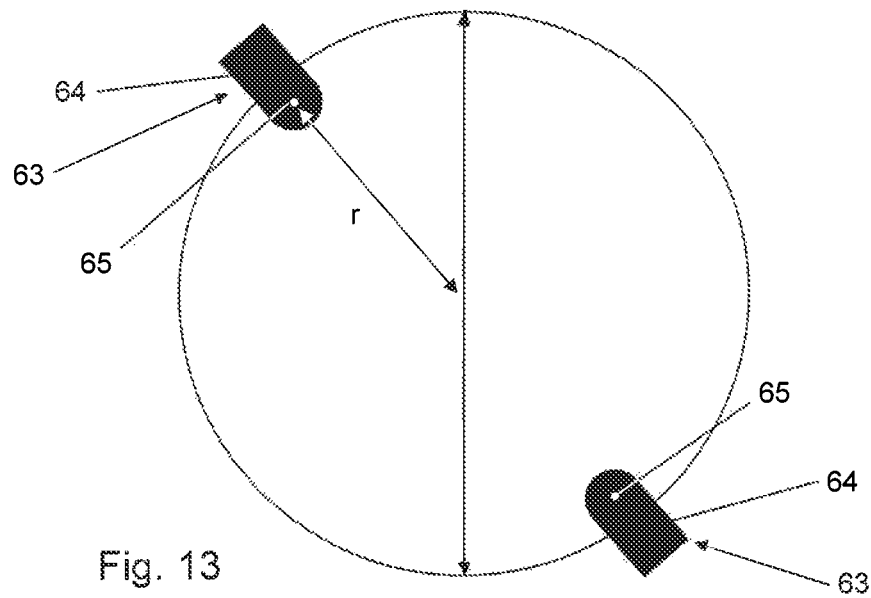
FIG. 13 is a schematic view of the collector of the lithographic apparatus shown in FIG. 12.

The collector comprises an isolated reflective feature 63. The isolated reflective feature 63 is located radially inward of the collector edge. FIG. 13 shows two isolated reflective features 63 mounted to a collector CO at diametrically opposed positions. The isolated reflective features 63 each comprise a reflector portion 65 and a relatively unreflective portion 64 that surrounds the reflector portion 65. The relatively unreflective portion 64 may be substantially unreflective of radiation from the radiation emitting plasma of the lithographic apparatus that is incident upon it in use. The relatively unreflective portion 64 may be substantially unreflective of the incident radiation due to a relatively high absorbance and/or transmittance of incident radiation. In some embodiments the relatively unreflective portion 64 may comprise a coating of a substantially black material. The relatively unreflective portion 64 defines the reflector portion 65. In this instance, the reflector portion 65 is a generally small circular mirror portion that may be created by not coating a portion of the isolated reflective feature 63 with a substantially black material. The reflector portion 65 reflects a greater proportion of the radiation incident on it compared to the relatively unreflective portion 64. It will be appreciated that in some embodiments the reflector portion 65 and relatively unreflective portion 64 may have a unitary construction. However, this need not be the case. For example, the relatively unreflective portion 64 may be separate to the reflector portion 65. In some embodiments the relatively unreflective portion 64 may be formed by a volume of air or by a volume of vacuum and the reflector portion 65 is formed from a separate reflector. In some embodiments, the relatively unreflective portion 64 may be reflective of the radiation produced by the radiation emitting plasma, but to a lesser extent than the reflector portion 65. The reflector portions 65 shown in FIG. 13 are located at a radial distance r, which is less than the radius of the edge of the collector CO.

Due to the fact that the reflector portions 65 of the isolated reflective features 63 are displaced from the edge of the collector CO it means that the radiation reflected by the isolated reflective features 63 is less affected by the non-uniform intensity profile of radiation reflected from the edge of the collector CO. For example, the reflector portion 65 of each isolated reflective feature 63 may reflect radiation which has a uniform intensity distribution.

The sensor arrangement 54b of this embodiment comprises a two dimensional sensor such as a PSD or a CCD. In a similar manner to the previously discussed embodiment, the curvature of the reflector 62 is chosen such that a movement in the location of the far field (and hence the far field position) due to either a 1 mm relative translation between the source collector module and the illuminator or a 1/a mrad relative tilt between the source collector module and the illuminator produce a shift of b/2a mm in the position of the image of the reflector portion 65 measured by the two dimensional sensor. By measuring the shift in the position of the image of the reflector portion 65 it is possible to determine the movement of the location of the far field (and hence the far field position). For example the movement of the location of the far field may be equal to the shift in the position of the image of the reflector portion 65. As such, the shift in the position of the image of the reflector portion 65 may be equal to the movement of far field position.

The reflector 62 of the reflector arrangement is mounted to the facetted field mirror 22. The intensity of the image of the reflective portion 65 imaged to the sensor arrangement 54b is substantially uniform across the entire image area because the radiation which is reflected by the reflective portion 65 is displaced from the radiation which is reflected by the edge of the collector CO. For this reason any non uniformity in the reflected radiation due to edge effects at the collector are substantially avoided. Because the intensity of the image of the reflective portion 65 imaged on to the sensor arrangement 54b is substantially uniform across the entire image area, determination of the position of the imaged reflector portion 65 (and hence any shift in the position of the imaged reflective portion) is more accurate than using an image of a reflector portion 65 which has a substantially non-uniform image intensity. This is particularly the case where the sensor is a PSD. This is because the PSD calculates the position of the center of the imaged reflector portion by calculating the average center of the power of radiation incident on the PSD. If an image is incident on the on the PSD which does not have a uniform intensity distribution, then the PSD may give a measurement of the average center of the power of radiation incident on the PSD which does not correspond to the geometric center of the image.

The use of a pair of isolated reflective features 63 (and a corresponding pair of two dimensional sensors) in order to measure the far field position (compared to the use of a detector arrangement which comprises a pair of detectors which measure the edge position of the radiation cone in order to determine the far field position) enables further measurement of the characteristics of the optical system to be measured. As before, a movement of the location of the far field position due to a relative translation between the source collector module and the illuminator by 1 mm will result in a shift in the position of the reflector portion 65 imaged on the sensor arrangement 54b by a/2b mm. Furthermore a movement of the location of the far field position due to a relative tilt between the source collector module and the illuminator about the intermediate focus IF by 1/a mrad will also produce a shift in the position of the imaged reflective pinhole portion measured by the sensor arrangement 54b of a/2b mm.

Figure 14:
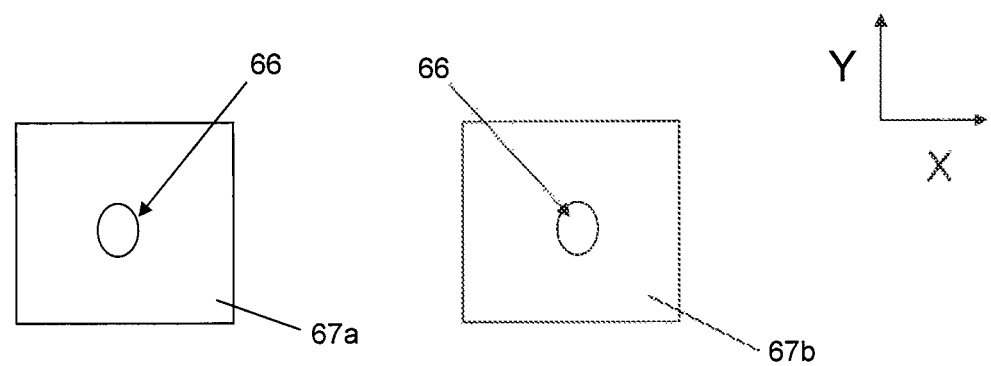
FIG. 14 is a schematic view of two two-dimensional sensors which may form part of the detector arrangement shown in FIG. 12.

The detector arrangement can also be used to measure rotation of the source collector module SO relative to the illuminator IL about the optical axis O of the system. FIG. 14 shows a schematic view of images of the isolated reflective features 63 shown in FIG. 13 which may fall on the two dimensional sensors of the sensor arrangement. Each image 66 corresponds to one of the reflector portions 65 of a isolated reflective feature 63 and is imaged on to a two dimensional sensor 67a, 67b, the two dimensional sensors forming part of the sensor arrangement. For example, the two dimensional sensor 67a may be associated with the isolated reflective feature 63 on the top left of the collector CO in FIG. 13 and the two dimensional sensor 67b may be associated with the isolated reflective feature 63 which is at the lower right of the collector CO shown in FIG. 13.

If the source collector module SO rotates about the optical axis O relative to the illuminator IL then the image 66 on the 2 dimensional sensor 67a will move in an opposite direction to the image 66 on the 2 dimensional sensor 67b. Relative rotation between the source collector module and the illuminator is sometimes referred to as $R_z$. The opposite movement of the images 66 in this case will be parallel to the x axis indicated in FIG. 14. For each 1 mrad rotation of the source collector module relative to the illuminator module about the optical axis O the image 66 on each sensor 67a, 67b will shift by a distance $p_x$ given by:

$$p_x = \frac{ap_h}{2b} \quad (2)$$

Where a is the distance between the intermediate focus and the center of the curved mirror 62, b is the distance between the center of the curved mirror 62 and the point on the sensor arrangement 54 on which the radiation reflected by the curved mirror 62 is incident, and $p_h$ is the distance between the reflective pinhole portions 65 (and hence the isolated reflective features 63). This calculation assumes that the reflector features 65 are symmetrically placed around the collector (i.e., they are diametrically opposed with respect to the optical axis of the system and an equal distance from the optical axis).

The detector arrangement according to this embodiment can also measure relative translation between the source collector module SO and the illuminator IL along the optical axis O. In this case, relative translation between the source collector module SO and the illuminator IL along the optical axis O will result in the images 66 shifting equal distances in opposite directions parallel to the y axis as shown in FIG. 14. For every 1 mm relative translation between the source collector module SO and the illuminator IL along the optical axis O, each of the images 66 will move across the sensors 67a and 67b (in the a direction parallel to the y direction as indicated in FIG. 14) by a distance $p_y$ given by:

$$p_y = \frac{p_h}{2b} \quad (3)$$

Again, this calculation assumes that the reflective pinhole portions 65 are symmetrically located around the collector CO (i.e., they are diametrically opposed with respect to the optical axis of the system and an equal distance from the optical axis).

Preferably the isolated reflective features 63 are located as close to the edge of the collector CO as possible. This allows the most accurate measurement of relative translation between the source collector module SO and the illuminator IL along the optical axis O. This is due to the fact that the greater the separation between the isolated reflective features 63 (and hence the greater the radial distance of each isolated reflective feature 63 from the optical axis), the greater the distance the images of the isolated reflective features 63 formed at each sensor arrangement will move per unit distance relative translation between the source collector module and the illuminator along the optical axis O. The greater the movement of an image of the isolated reflective feature 63 formed at the sensor arrangement per unit distance relative translation between the source collector module and the illuminator along the optical axis O, the greater the sensitivity of the sensor arrangement to relative translation between the source collector module and the illuminator along the optical axis O. It follows that it may be preferable for the isolated reflective features 63 to be separated by as great a distance as possible (i.e., such that their radial distances from the optical axis O are as great as possible). In some embodiments this may mean that the isolated reflective features 63 are as close to the edge of the collector CO as possible. For example, the isolated reflective features 63 may be located at a radial distance from the optical axis OA which is just less than the radius of the collector (i.e., such that the isolated reflective features 63 are just radially inboard of the edge of the collector CO).

The embodiment shown in FIG. 12 may be advantageous for several reasons. First, any movement of the far field position due to relative translation/tilt between the source collector module and the illuminator is determined by measuring a shift in the position of the image of an isolated reflective feature as opposed to a shift in position of an edge. This avoids any inaccuracies in the edge measurement process which occur due to the non-uniform intensity profile of the edge of the radiation, e.g., if the edge of the radiation has an intensity profile which is not a step function. Furthermore, as with the previously described embodiment, which has a reflector arrangement that comprises a curved reflector, no separate consideration of the movement of the location of the far field due to relative translation and relative tilt between the source collector module and the illuminator is required. Furthermore, the effect of collector aberrations and plasma misalignment are minimised due to the fact that the reflected far field (which lies in the reflected plane RP shown in FIG. 12) is imaged to the sensor arrangement 54b and not the real far field. Finally, if two or more isolated reflective features are used in combination with corresponding reflector arrangements and sensor arrangements, it is possible to measure both rotation and translation of the source collector module relative to the illuminator around and along the optical axis respectively.

When designing a detector assembly according to the embodiments shown in FIGS. 12 to 14, it may be beneficial that the two dimensional sensors which form a part of the sensor arrangement 54b are capable of measuring an anticipated range of movement of the far field due to relative translations and/or relative tilts between the source collector module and the illuminator. To this end it is desirable that the sensor has a diameter given by 2CM where C is the maximum relative tilt between the source collector module and the illuminator it is desired to capture in mrad (for example ±5 to ±10 mrad) and M is the magnification factor from the collector to the sensor. The magnification factor from the collector to the sensor is given by b/(a+L), where L is the distance between the intermediate focus and the collector.

Another aspect of the design of the system which may be considered is the size of the reflector portion of the isolated reflective feature. In some embodiments it may be advantageous for the reflector portion to have a diameter when imaged at the sensor which is between approximately a quarter and approximately a half of the width of the sensor. The use of a reflector portion with an imaged diameter of this size may ensure that the entire image of the reflector portion is captured by the sensors. This may result in the detector arrangement having a linear response across a certain rotation range. For example, the reflective portion may have a diameter which is less than about 5 mm.

A further consideration when designing an embodiment of the invention as shown in FIGS. 12 to 14 is that radiation may be reflected from any part of the collector CO (other than the isolated reflective feature) so that it is incident on the sensor arrangement. This would be undesirable because any radiation which is incident on the sensor arrangement which is not reflected by the isolated reflective feature may cause the sensor arrangement to incorrectly determine the position of the image of the isolated reflective feature and hence incorrectly determine the far field position. In order to prevent this, the relatively unreflective portion of the isolated reflective feature may have a minimum extent so that the movement of the location of the far field due to a relative tilt between the source collector module and the illuminator which is within the desired relative tilt capture range C does not cause radiation from outside the isolated reflective feature to be incident on the sensor arrangement. The extent of the relatively unreflective portion of the isolated reflective feature may be chosen such that it is approximately twice the distance that may be moved by the isolated reflective feature at the collector. If the desired capture range of the detector arrangement is a tilt between the source collector module and the illuminator of between ±C mrad then the isolated reflective feature movement at the collector level will be 2CL mm, where again L is the distance between the intermediate focus and the collector. It follows that the minimum extent of the unreflective portion of the isolated reflective feature will be about 4CL mm. As previously discussed, the capture range of the detector arrangement may be such that C has a value of less than 20 mrad, preferably between 5 and 10 mrad.

Finally, the diameter of the curved mirror which forms part of the reflector arrangement is preferably such that it is large enough to accommodate movement of the image of the isolated reflective feature moving across it the far field moves due to a relative tilt between the source collector module and the illuminator which is within the desired capture range of ±C mrad. In this case, the minimum diameter of the curved mirror is given by 2Ca mm, where a is the distance between the intermediate focus and the curved reflector.

It will be appreciated that the detector arrangement of any of the previously described embodiments may comprise a processor which compares the far field position measured by the detector arrangement to a target far field position. The detector arrangement may provide command signals to at least one actuator which can produce relative movement between the source collector module and the illuminator. If the detector arrangement measures the far field position, and the measured far field position is not the target far field position, then the detector arrangement may provide command signals to the at least one actuator to energise the actuator such that it produces relative movement between the source collector module and the illuminator so as to move the far field position at least partially toward the target position.

It will be appreciated that although the isolated reflective feature has a reflector portion, the shape of which is generally circular, it will be appreciated that the shape of the reflector portion may be any appropriate shape. Such a shape may preferably be rotationally symmetric. This may result in the image of the isolated reflective feature formed on the two dimensional sensor being rotationally symmetric. In the case where a 2d PSD is used, this may ensure that the average center of the power of the radiation incident on the sensor (and hence an output of the sensor) corresponds to the geometric center of the image.

Furthermore, it will be appreciated that the isolated reflector region of the embodiments with a planar mirror is described as a generally circular (despite being shown in the figures as having a generally square shape). This need not be the case. The shape of the discrete reflective portion of the reflector arrangement may have any appropriate shape. Such a shape may preferably be rotationally symmetric. This may result in the image of the isolated reflector region formed on the two dimensional sensor being rotationally symmetric. In the case where a 2d PSD is used, this may ensure that the average center of the power of the radiation incident on the sensor (and hence an output of the sensor) corresponds to the geometric center of the image.

The reflector arrangement of the described embodiments is mounted on the reflector (for example the facetted field mirror) of the illuminator. In some embodiments of the invention, the reflector arrangement may be integrated with the reflector of the illuminator. Similarly, the isolated reflective feature is described as being mounted to the collector. In some embodiments, the isolated reflective feature may be integrated with the collector. For example, the reflector portion of an isolated reflective feature may be formed by part of the collector and the relatively unreflective portion may comprise a substantially unreflective mask which is intermediate radiation emitting plasma and the collector. The mask may be mounted to the collector.

The curved mirror of the reflector arrangement described in relation to some embodiments may have any appropriate shape provided it has a radius of curvature as previously discussed. For example the curved mirror may be spherical or elliptical.

The planar mirror of the reflector arrangement described in relation to some embodiments may not be exactly planar. For example, the mirror may be non-planar, but comprise a generally planar portion. Any appropriate shape of mirror may be used.

In an embodiment described above, the sensor arrangement comprises a one dimensional sensor which measures the position of the image of the edge of the radiation cone which is incident upon it, and a two dimensional sensor which measures the position of the image of the isolated reflector region which is incident upon it. Alternatively, the sensor arrangement may comprise a two dimensional sensor onto which both the edge of the radiation cone and the isolated reflector region are imaged. For example, such a two dimensional sensor may be a 2d CCD. In this case the detector arrangement may comprise a processor which is capable of processing an output of the two dimensional sensor and determining the position on the 2d CCD of the image of the edge of the cone of radiation and the position of the image of the isolated reflector region.

It will be appreciated that although the described embodiments have detector arrangements which comprise radiation intensity sensors which measure the intensity of radiation in order to determine the far field position, this need not be so. Any appropriate sensor which measures an appropriate property of the radiation reflected by the reflector arrangement may be used. For example, a material or device may be used to change another property (e.g., wavelength or phase) of a portion of the radiation which is directed from the source collector module to the illuminator. The property of that portion of radiation may then be different to that property of substantially the rest of the radiation. The portion of the radiation which has a property that is changed by the material or device may be a portion of radiation which is reflected by a particular portion of the collector. A sensor can then be used to detect the difference in the property of radiation between the portion of the radiation that has had that property changed (by the material or device) and the rest of the radiation. If the location of the portion of the collector which corresponds to the portion of radiation which undergone a property change is known; and if the sensor is able to measure the position on the sensor unto which the radiation which has undergone the property change is incident; then it may be possible to determine the far field position in an equivalent manner to using the edge of the collector and a sensor which measures the intensity of the radiation. It will be appreciated that the edge of the collector constitutes a feature which changes a property of the radiation which is reflected by the collector. This is because beyond the edge of the collector no radiation will be reflected by the collector.

Within this description the terms relative translation between the source collector module and the illuminator, and relative tilt between the source collector module and the illuminator have been used. It will be appreciated that these terms may refer to a relative translation or tilt between not only the whole source collector module and the whole illuminator, but also between part of the source collector module and part of the illuminator.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens," where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

The invention claimed is:

1. A lithographic apparatus comprising:
a source collector module including a collector configured to collect radiation from a radiation source;
an illuminator configured to condition the radiation collected by the collector and to provide a radiation beam; and
a detector arrangement comprising:
a reflector arrangement, comprising a curved reflector, disposed in a fixed positional relationship with respect to the illuminator, the reflector arrangement being arranged to reflect radiation from the source collector module and a radius of curvature (R) of the curved reflector is given by $$R = \frac{4ab}{(b+2a)}$$

wherein a is a distance between an intermediate focus of the radiation collected by the collector and a center of the curved reflector and b is a distance between the center of the curved reflector and a sensor arrangement, wherein the sensor arrangement is disposed in a fixed positional relationship with respect to the reflector arrangement, the sensor arrangement being configured to measure at least one property of radiation reflected by the reflector, and wherein the detector arrangement is configured to determine the location of a far field position of the radiation as a function of at least one property of the radiation reflected by the reflector and measured by the sensor arrangement.

2. A lithographic apparatus according to claim 1, wherein the far field position is the geometric center of the far field or the average center of the power distribution of the far field.

3. A lithographic apparatus according to claim 1, wherein the sensor arrangement comprises a one-dimensional sensor.

4. A lithographic apparatus according claim 3, wherein the one-dimensional sensor is an edge detection sensor.

5. A lithographic apparatus according to claim 1, wherein the reflector arrangement comprises a planar reflector.

6. A lithographic apparatus according to claim 5, wherein the reflector arrangement further comprises an isolated reflector region.

7. A lithographic apparatus according to claim 6, wherein the reflector arrangement further comprises a substantially unreflective region and a reflective region, the substantially unreflective region being between the reflective region and the isolated reflector region.

8. A lithographic apparatus according to claim 7, wherein the substantially unreflective region, reflective region and isolated reflector region are formed as a one-piece component or as integral components.

9. A lithographic apparatus according to claim 1, wherein the sensor arrangement comprises a two-dimensional sensor.

10. A lithographic apparatus according to claim 9, wherein the two-dimensional sensor is a position sensitive device (PSD) or a charge coupled device (CCD).

11. A lithographic apparatus according to claim 1, wherein the detector arrangement comprises a plurality of similar reflector arrangements and corresponding similar sensor arrangements.

12. A lithographic apparatus comprising:
a source collector module including a collector configured to collect radiation from a radiation source;
an illuminator configured to condition the radiation collected by the collector and to provide a radiation beam; and
a detector arrangement comprising:
a reflector arrangement, comprising a curved reflector, disposed in a fixed positional relationship with respect to the illuminator, the reflector arrangement being arranged to reflect radiation from the source collector module; and
a sensor arrangement disposed in a fixed positional relationship with respect to the reflector arrangement, the sensor arrangement being configured to measure at least one property of radiation reflected by the reflector, wherein the detector arrangement is configured to determine the location of a far field position of the radiation as a function of at least one property of the radiation reflected by the reflector and measured by the sensor arrangement, and wherein the curvature of the reflector is configured such that a change in far field position measured by the detector arrangement due to a relative translation between the source collector module and illuminator by a distance of 1 mm is the same as a change in far field position measured by the detector arrangement due to a relative tilt between the source collector module and illuminator about an intermediate focus of 1/a mrad, where a is the distance between an intermediate focus of the radiation collected by the collector and a center of the curved reflector.

13. A lithographic apparatus according to claim 12, wherein when the far field position moves due to a relative translation between the source collector module and illuminator of 1 mm or due to a relative tilt between the source collector module and illuminator about an intermediate focus of 1/a mrad, an image formed on the sensor arrangement by radiation reflected by the reflector arrangement moves from a first position to a second position, the distance between the first and second positions being b/2a mm, where b is the distance between the center of the curved reflector and the sensor arrangement.

14. A lithographic apparatus comprising:
a source collector module including a collector configured to collect radiation from a radiation source;
an illuminator configured to condition the radiation collected by the collector and to provide a radiation beam;
a detector arrangement comprising:
a reflector arrangement disposed in a fixed positional relationship with respect to the illuminator, the reflector arrangement being arranged to reflect radiation from the source collector module; and
a sensor arrangement disposed in a fixed positional relationship with respect to the reflector arrangement, the sensor arrangement being configured to measure at least one property of radiation reflected by the reflector,
wherein the detector arrangement being configured to determine the location of a far field position of the radiation as a function of at least one property of the radiation reflected by the reflector and measured by the sensor arrangement; and
an isolated reflective feature, at least part of which is mounted to or forms part of the collector, wherein the isolated reflective feature comprises a reflector portion located in a fixed positional relationship with the collector at a radial distance which is less than the radius of the collector, the reflector portion being surrounded by a relatively unreflective portion.

15. A method of aligning a source collector module and an illuminator of a lithographic apparatus, the source collector module including a collector configured to collect radiation from a radiation emitting plasma, the illuminator being configured to condition the radiation collected by the collector and to provide a radiation beam, and wherein the lithographic apparatus has an actuator and a detector arrangement having a reflector arrangement, comprising a curved reflector, disposed in a fixed positional relationship with respect to the illuminator wherein a radius of curvature (R) of the curved reflector is given by $$R = \frac{4ab}{(b+2a)}$$

wherein a is a distance between an intermediate focus of the radiation collected by the collector and a center of the curved reflector and b is a distance between the center of the curved reflector and a sensor arrangement and wherein the sensor arrangement is disposed in a fixed positional relationship with respect to the reflector arrangement, the method comprising:
- measuring, with the sensor arrangement, at least one property of radiation reflected by the reflector;
- determining, with the detector arrangement, the location of a far field position of the radiation as a function of at least one property of the radiation reflected by the reflector and measured by the sensor arrangement;
- comparing the location of the far field position measured by the detector arrangement to a target far field position; and
- producing, with the actuator, a relative movement between at least part of the source collector module and at least part of the illuminator to move the location of far field position toward the target far field position.

* * * * *